(12) United States Patent
Holman

(10) Patent No.: US 7,772,529 B2
(45) Date of Patent: Aug. 10, 2010

(54) SELECTIVE PERMALLOY ANISOTROPY

(75) Inventor: Perry A. Holman, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 986 days.

(21) Appl. No.: 11/077,351

(22) Filed: Mar. 10, 2005

(65) Prior Publication Data

US 2006/0204775 A1    Sep. 14, 2006

(51) Int. Cl.
*H05B 6/02* (2006.01)
*H05B 6/10* (2006.01)

(52) U.S. Cl. .................. 219/645; 219/601; 148/108; 148/121

(58) Field of Classification Search .............. None
See application file for complete search history.

(56) References Cited

U.S. PATENT DOCUMENTS

| | | | |
|---|---|---|---|
| 4,470,873 A | 9/1984 | Nakamura | 156/640 |
| 4,803,580 A | 2/1989 | Mowry | 360/113 |
| 4,860,138 A | 8/1989 | Vinal et al. | 360/113 |
| 4,967,298 A | 10/1990 | Mowry | 360/113 |
| 5,119,025 A | 6/1992 | Smith et al. | 324/252 |
| 5,128,614 A | 7/1992 | Schewe | 324/249 |
| 5,479,308 A | 12/1995 | Voegeli et al. | 360/113 |
| 5,667,879 A | 9/1997 | Haji-Sheikh | 428/209 |
| 5,945,898 A | 8/1999 | Judy et al. | 335/78 |
| 6,088,204 A | 7/2000 | Farrow et al. | 360/327 |
| 6,437,949 B1 | 8/2002 | Macken et al. | 360/319 |
| 6,483,677 B2 * | 11/2002 | Nakatani et al. | 360/324.2 |
| 6,831,458 B2 | 12/2004 | Haji-Sheikh et al. | 324/252 |
| 2006/0127701 A1 * | 6/2006 | Ruigrok et al. | 428/811 |
| 2007/0030604 A1 * | 2/2007 | Nakatani et al. | 360/324.1 |

OTHER PUBLICATIONS

Holman, Perry A. Ph.D. *Magnetoresistance (MR) Transducers* 1st Edition, Jul. 2004, pp. 1-27.
Holman, Perry A., B.S.E.E., M.S.E.E. *Design Model of Longitudinal Anisotropic Magnetoresistance of Permalloy Prior to Magnetization Reversal*, Aug. 2004.

* cited by examiner

*Primary Examiner*—John P Sheehan

(57) ABSTRACT

Methods and systems for improving permalloy sensitivity. One or more permalloy sensing components can be configured upon a substrate, and one or more conductors are located above a portion of the permalloy sensing component of interest. A current can then be initiated through the conductor. The substrate can then be heated such that the current creates a magnetic field that modifies the anisotropy of the portion of the permalloy sensing component of interest, thereby providing selective anisotropy and improving permalloy sensitivity thereof.

10 Claims, 4 Drawing Sheets

SELECTIVE PERMALLOY ANISOTROPY

TECHNICAL FIELD

Embodiments are generally related to magnetoresistive-based detection devices and techniques. Embodiments are also related to magnetoresistive sensors incorporating permalloy components. Embodiments are additionally related to techniques for improving the sensitivity of permalloy devices.

BACKGROUND OF THE INVENTION

Magnetoresistive components, such as permalloy, can be utilized in a variety of sensing applications, such as, for example, in the contactless detection of changes in state, such as the measurement of an angular position of a rotatably mounted part. Magnetoresistive-based sensors typically include magnetic field-dependent resistors, which are arranged in a bridge circuit configuration and through which a control current is fed. When a magnetoresistive-based sensor is influenced by a magnetic field, a voltage can be established in which the magnitude of the voltage depends on the magnitude and direction of the magnetic field associated with the sensor.

The relationship between an associated bridge circuit voltage and the magnetic field direction can be utilized in a contactless magnetoresistive sensor, for example, to detect the angular position of a rotatably mounted part. Such sensors are particularly useful in automotive applications. Magnetoresistive sensors are typically configured from a magnetoresistive film that is formed from a magnetic substance that exhibits a magnetoresistive effect and generally possesses a single active layered structure.

A magnetoresistive sensor may be acted upon by a magnetic field oriented in a particular manner, such that a definite control current can be applied to the current contacts of an associated bridge circuit. The voltage that is then established at the other contacts can be measured on an ongoing basis. In general, the pattern of magnetoresistive material utilized in magnetoresistive sensors can be connected electrically in a Wheatstone bridge arrangement in order to sense changes in the resistance of the magnetoresistive material in response to changes in the strength and direction of a magnetic field component in the plane of the magnetoresistive elements. In order to monitor the changes in the resistance of the material, associated components, such as amplifiers, are generally connected together to form an electrical circuit, which provides an output signal that is representative of the strength and direction of the magnetic field in the plane of the sensing elements.

When the circuit is provided on a silicon substrate, for example, electrical connections between associated components can be made above the surface of the silicon or by appropriately doped regions beneath the components and within the body of the silicon substrate. Components can be connected to each other above the surface of the silicon by disposing conductive material to form electrically conductive paths between the components. When appropriately doped regions within the silicon substrate connect components in electrical communication with each other, an electrically conductive path can be formed by diffusing a region of the silicon with an appropriate impurity, such as phosphorous, arsenic or boron to form electrically conductive connections between the components.

Permalloy is often utilized in Magnetoresistive-based sensing applications that require increasing sensitivity. Note that as utilized herein, the term "permalloy" generally refers to any of several alloys of nickel and iron having high magnetic permeability. Typical permalloy-based magnetoresistive devices utilize the small electrical resistance change of the permalloy film to a magnetic field by forcing a current through the resistor and measuring the voltage change. This is often accomplished in a Wheatstone bridge configuration with many resistors arranged electrically in series per bridge element to maintain the current low and the sensitivity high.

Recent activity has indicated that the direction of anisotropy greatly affects the low field sensitivity of permalloy. One of the primary problems with conventional techniques of producing permalloy is that the anisotropy thereof is defined at deposition, or a later time. The anisotropy can only be set, however, for the entire substrate or wafer utilized in the production process.

Anisotropy, an important factor in permalloy-based detection devices, can be defined as the tendency of a material to react differently to stresses applied in different directions or the characteristics of exhibiting different values of a property in different directions with respect to a fixed reference system in the material. Based on the foregoing, it is believed that a need exists for a new technique that provides for improved sensitivity of permalloy based sensing devices, especially for low field (i.e., near zero Gauss) applications. It is believed that the unique methods and systems disclosed herein solve these needs.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for Magnetoresistive-based detection devices and techniques.

It is another aspect of the present invention to provide for sensors incorporating permalloy sensing components.

It is yet another aspect of the present invention to provide for the improvement of the sensitivity of permalloy devices.

The aforementioned aspects of the invention and other objectives and advantages can now be achieved as described herein. Methods and systems for improving permalloy sensitivity are disclosed. In general, one or more permalloy sensing components can be configured upon a substrate. One or more conductors can then be located above a portion of the permalloy sensing component of interest. A current can then be initiated through the conductor. The substrate can then be heated such that the current creates a magnetic field that modifies the anisotropy of the portion of the permalloy sensing component of interest, thereby providing selective anisotropy and improving permalloy sensitivity thereof. The conductor(s) can be implemented as a current strap, while substrate can be a wafer. The substrate can be heated to a temperature, for example, of approximately 300° C. in order to permit the magnetic field created by the current to easily modify the anisotropy direction.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
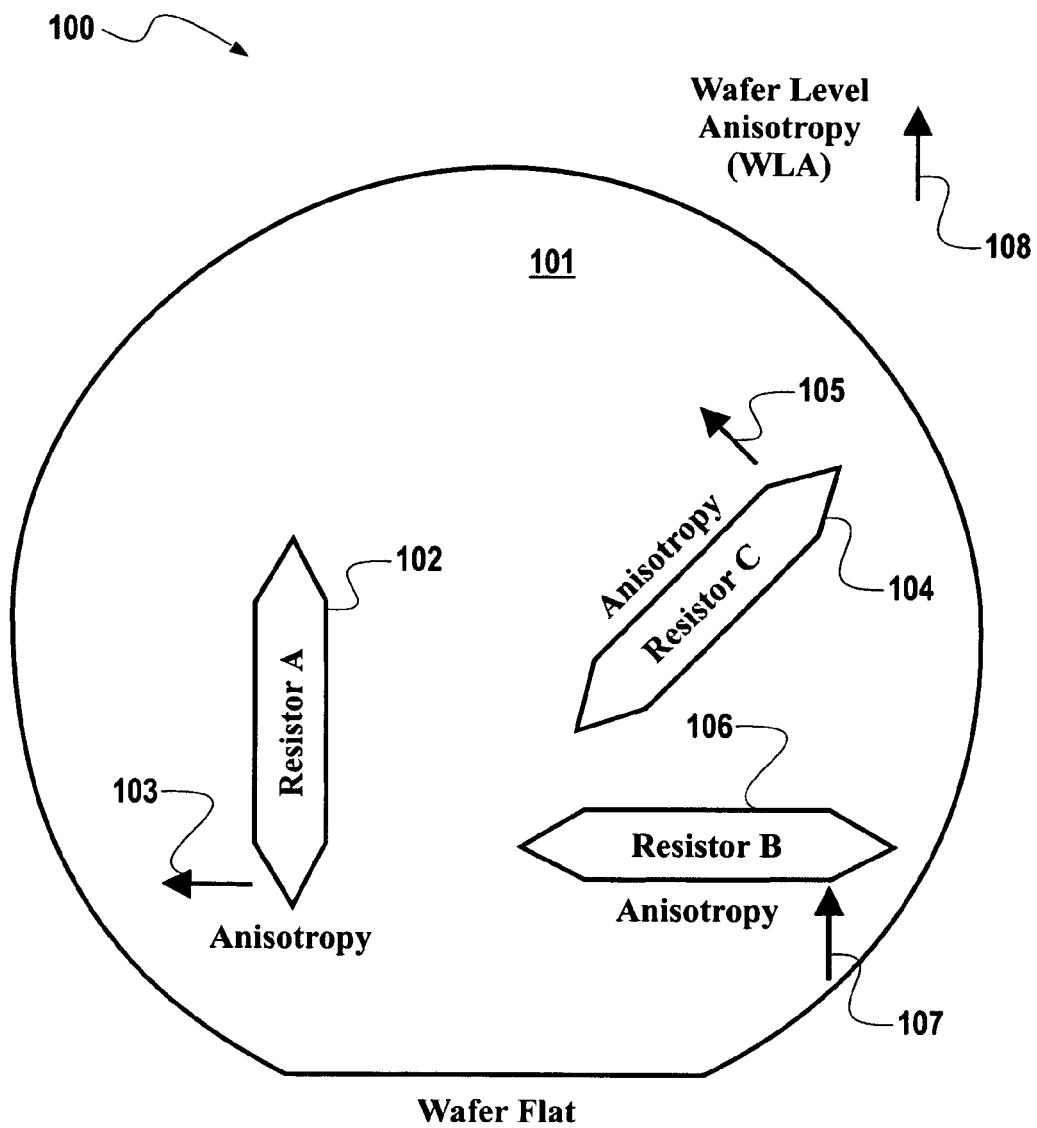
FIG. 1 illustrates a system depicting wafer level anisotropy in accordance with one embodiment.

FIG. 1 illustrates a system 100 depicting wafer level anisotropy in accordance with one embodiment. System 100 generally includes a substrate or wafer 101 upon which one or more magnetoresistive permalloy components 102, 104, and 106 are configured. Arrow 103 represents the desired anisotropy associated with component 102, while arrow 105 represents the desired anisotropy associated with component 104. Additionally, arrow 107 represents the desired anisotropy associated with component 106. Similarly, arrow 108 represents the currently created wafer level anisotropy (WLA). Note that substrate or wafer 101 can comprise glass or ceramic. If, however, permalloy components 102, 104, and 106 are to be utilized in association with electronic circuitry, substrate or wafer 101 should be implemented as silicon.

Figure 2:
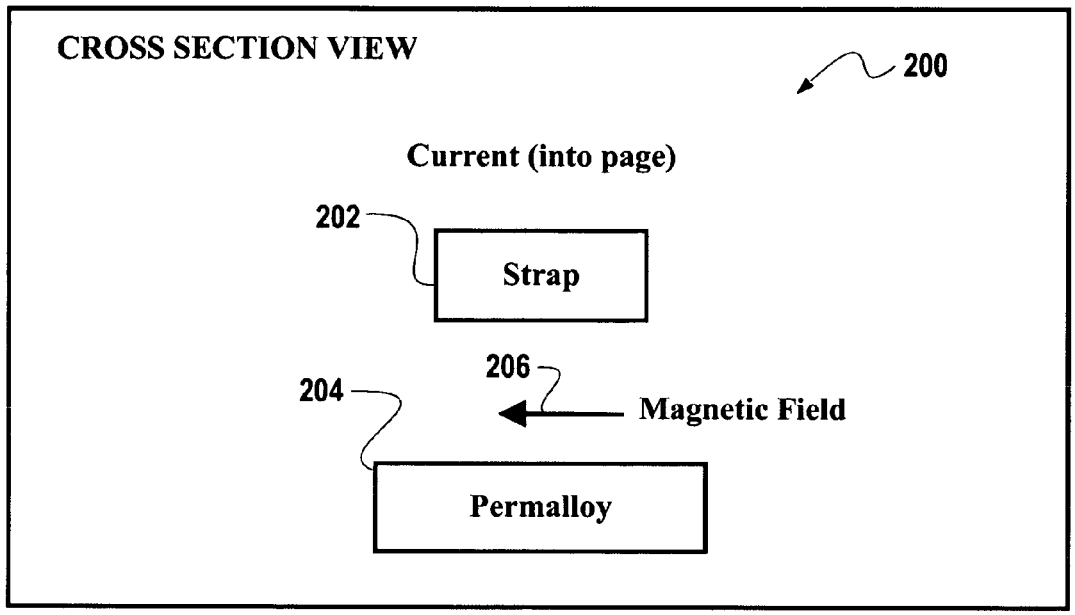
FIG. 2 illustrates a cross-sectional view of a selective permalloy anisotropic system, in accordance with one embodiment.

FIG. 2 illustrates a cross-sectional view of a selective permalloy anisotropic system 200, in accordance with one embodiment. System 200 generally includes a conductor 202 placed above a portion of a permalloy sensor or permalloy sensing component 204 of interest. Permalloy component 204 can be configured upon a wafer (not shown in FIG. 2) such as wafer 101 depicted in FIG. 1. The permalloy sensing component 204 is similar to magnetoresistive permalloy components 102, 104, and/or 106 depicted in FIG. 1 and can be implemented in the context of a system such as that indicated in FIG. 1.

Current can be initiated through the conductor 202, and the wafer then heated to, for example, approximately 300° C. The current then creates a magnetic field as indicated by arrow 206 that modifies the anisotropy. Note that in FIGS. 1-5 herein, identical or similar parts or elements are generally indicated by identical reference numerals.

Note that the heating temperature of 300° C. may differ, depending upon design considerations. The embodiments disclosed herein can be modified to incorporate the concept of "self-heating". Normal annealing for permalloy is around 300° C. To create the magnetic field from the "strap," a current is sent through the strap (which may be of gold or aluminum, as an example). The magnetic field from a simple conductor is fairly small, and is linearly proportional to current. Also, the resistance of the strap is non-zero.

Thus, due to the large amount of current through the strap, to make the field, and the resistance of the strap (with power=current*current*resistance), there is power dissipated during the creation of the magnetic field. This power dissipation will tend to heat the substrate. It is likely that with proper thermal techniques utilizing a heating mechanism such as, for example, but not limited to a heat sink, the substrate can be controlled at 300° C. only with heating from the current straps (i.e. Self-heating).

The "Curie Temperature" can also be adapted to the embodiments disclosed herein, again depending upon design considerations. Curie temperature is the temperature above which a magnetic material loses magnetic properties. As mentioned above, annealing is typically done at 300° C. for permalloy (for a wide variety of reasons). The Curie temperature of permalloy is approximately 600° C. One may take the substrate above the Curie temperature, and then allow the substrate to cool. During the cooling, the current can be applied, and the magnetic field applied, such that the selective anisotropy may be applied. Essentially, at 300° C., the rotated anisotropy is gentle, at 600° C., the rotated anisotropy is brutal. Also, the properties of magnetic materials taken above the Curie temperature are typically worse than those only annealed (300° C.).

Note that some non-limiting examples of permalloy components that can be adapted for use in implementing permalloy sensing component 204 and/or permalloy sensing components 102, 104, and 106 is disclosed in U.S. Pat. No. 5,667,879, entitled, "TaN/NiFe/TaN anisotropic magnetic sensor element," which issued to Michael J. Haji-Sheikh on Sep. 16, 1997 and is assigned to Honeywell International Inc. U.S. Pat. No. 5,667,879 is incorporated herein by reference.

Figure 3:
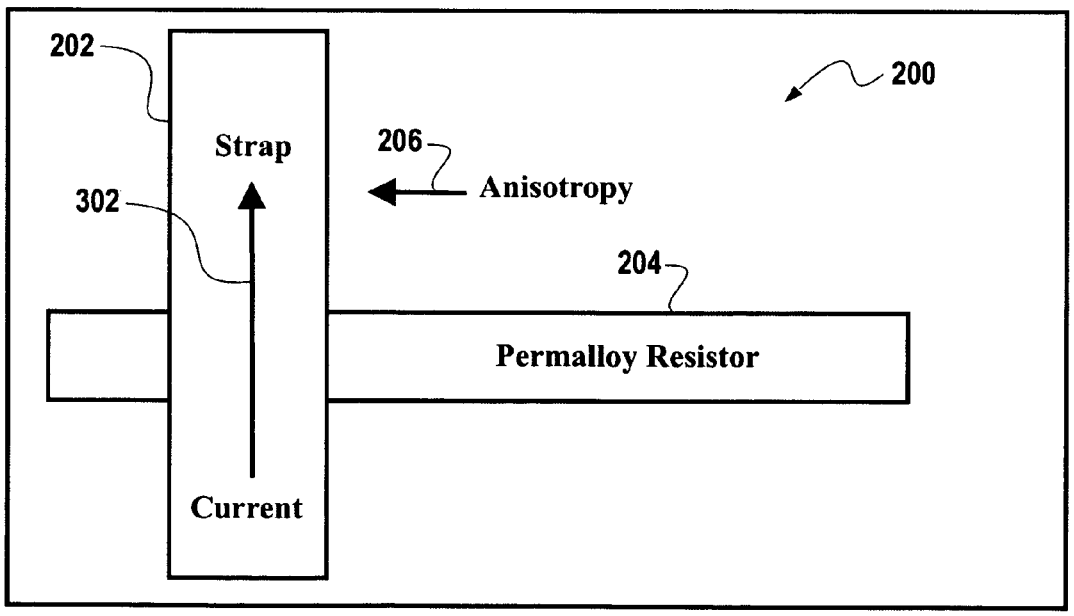
FIG. 3 illustrates a top view depicting length anisotropy for the system depicted in FIG. 2 in accordance with the embodiment depicted in FIG. 2.
Figure 4:
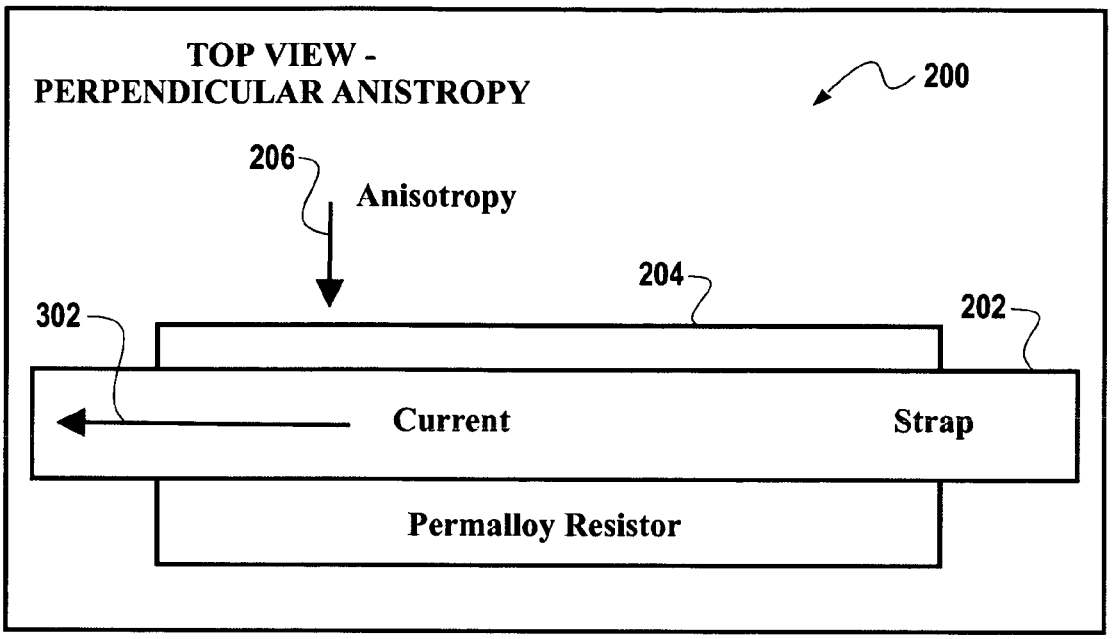
FIG. 4 illustrates a top view depicting perpendicular anisotropy for the system depicted in FIGS. 2-3 in accordance with an alternative embodiment.
Figure 5:
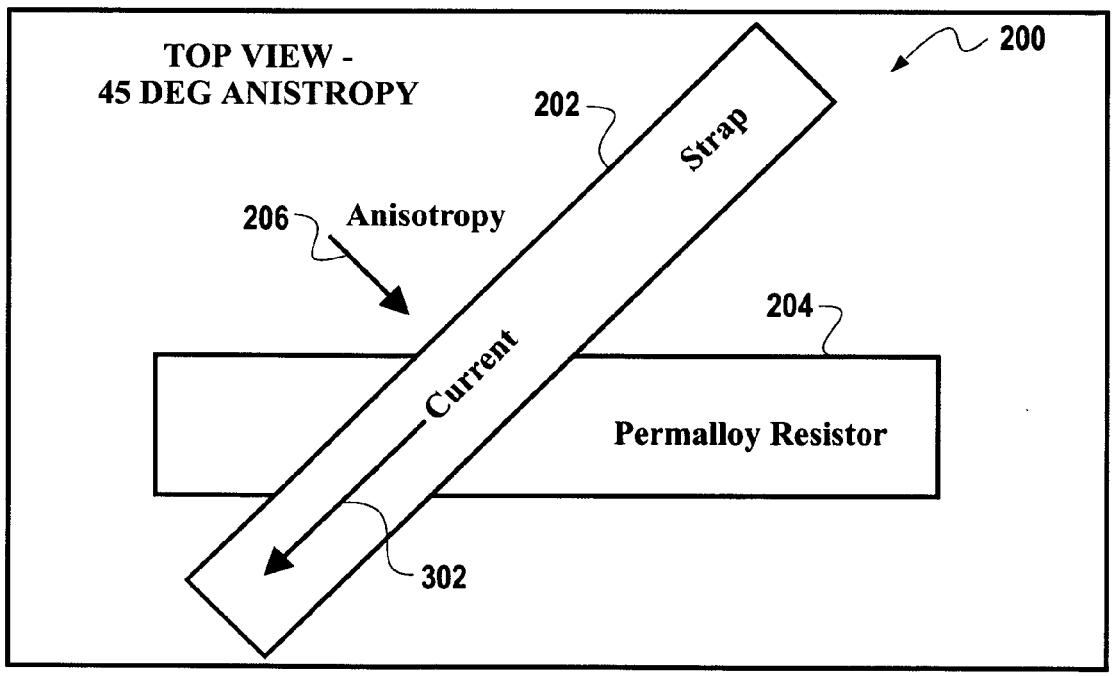
FIG. 5 illustrates a top view depicting 45° anisotropy for the system depicted in FIGS. 2-4 in accordance with an alternative embodiment.

FIG. 3 illustrates a top view depicting length anisotropy for the system 200 depicted in FIG. 2 in accordance with the same embodiment. FIG. 4 illustrates a top view depicting perpendicular anisotropy for the system 200 depicted in FIGS. 2-3 in accordance with an alternative embodiment. FIG. 5 illustrates a top view depicting 45° anisotropy for the system 200 depicted in FIGS. 2-4 in accordance with an alternative embodiment. Based on the foregoing, it can be appreciated that system 200 depicted in FIGS. 2-4 permits individual portions of a permalloy sensor or component, such as permalloy sensing component 204 to possessive a selective anisotropy and thereby increase sensitivity for sensing applications thereof.

Figure 6:
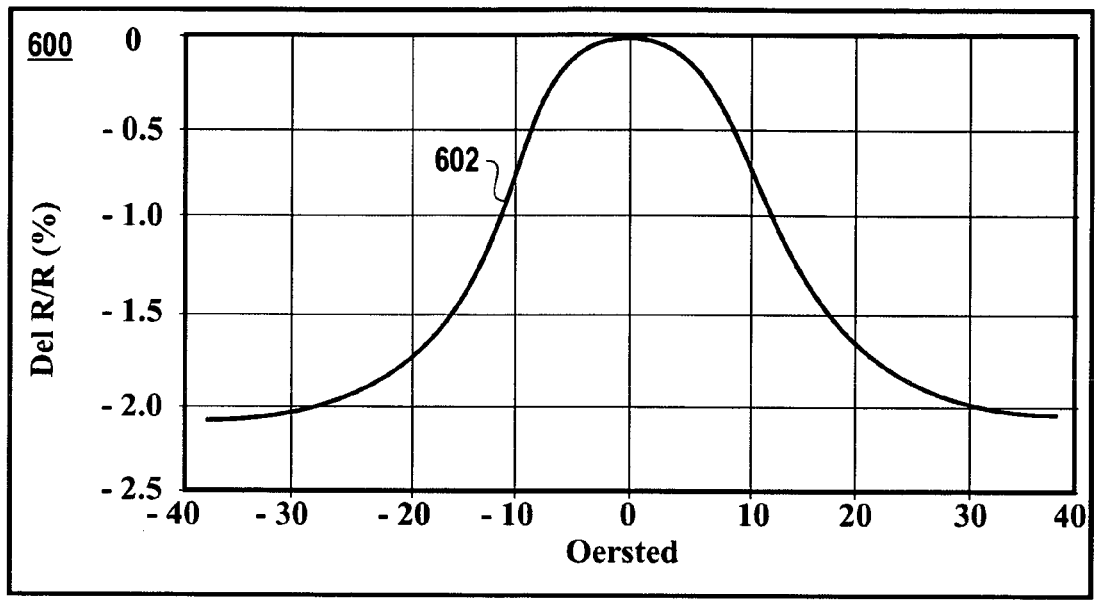
FIG. 6 illustrates a graph illustrating a typical hard axis response of a "normal (0 Degree)" resistor.
Figure 7:
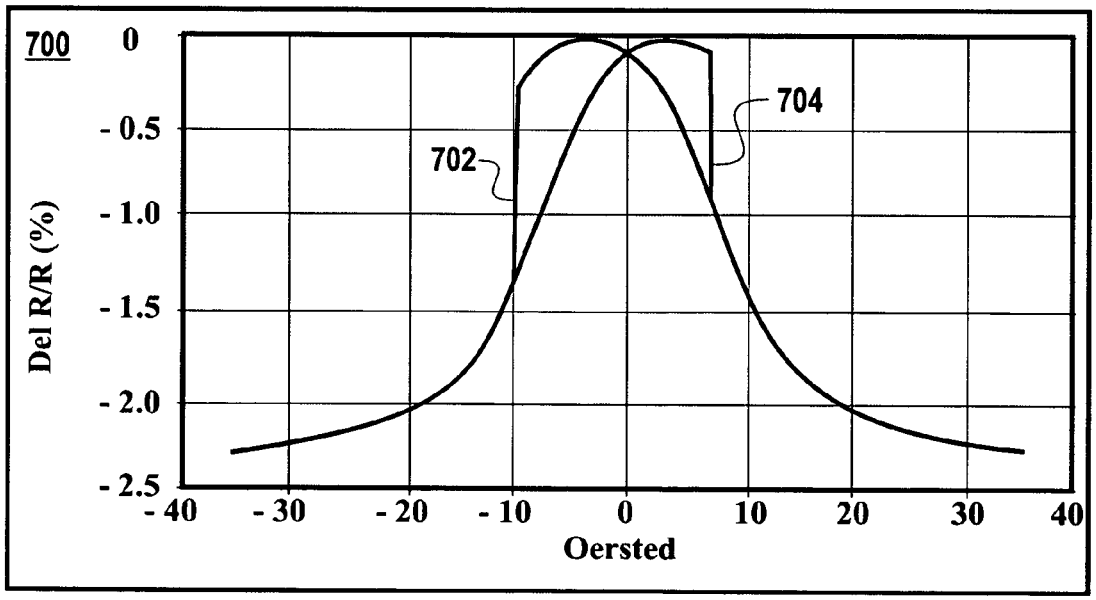
FIG. 7 illustrates a graph depicting a hard axis response of a 90 degree anisotropy resistor.

FIG. 6 illustrates a graph 600 illustrating a typical hard axis (ha) response of a "normal (0 Degree)" resistor. Note that the curve 602 depicted in graph 600 in FIG. 6 is smooth, and flat around 0 Gauss (Oersted). FIG. 7, on the other hand, illustrates a graph 700 depicting the hard axis response of a 90 degree anisotropy resistor. FIGS. 6-7 thus illustrate graphs depicting 0 and 90 degree configurations. Note that the direction orthogonal to the length of the resistor, in the plane of the magnetoresistive film, is generally referred to as the "hard axis" or "ha", and along the length of the resistor, the "easy axis".

Based on graphs 600 and 700, it can be appreciated that around zero Oersted, the slope is large compared to the normal resistor. The data presented in FIGS. 6-7 is provided for general illustrative and edification purposes only and is not considered a limiting feature of the embodiments, but merely to provide a context for the general concept of rotated anisotropy devices disclosed herein.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A system for improving permalloy sensitivity, comprising:
   a substrate;
   at least one permalloy sensing component comprised of a material having a high magnetic permeability configured above said substrate; and
   at least one conductor in thermal communication with and magnetically coupled to a portion of said at least one permalloy sensing component;
   wherein said system is structured such that a modification current through said at least one conductor heats said portion of said at least one permalloy sensing component to a heated temperature via conduction of heat generated by resistive heating of said at least one conductor and also creates a magnetic field at said portion of said at least one permalloy sensing component, where said heated temperature and said magnetic field collectively are sufficient to modify an anisotropy of said portion of said at least one permalloy sensing component, thereby providing selective anisotropy that persists after cessation of said modification current to improve sensitivity of said system.

2. The system of claim 1 wherein said at least one conductor comprises a current strap.

3. The system of claim 1 wherein said heated temperature is approximately 300° C.

4. The system of claim 1 wherein said at least one permalloy sensing component comprises NiFe alloy.

5. The system of claim 1 wherein said at least one permalloy sensing component comprises TaN alloy.

6. A system for improving permalloy sensitivity, comprising:
   at least one permalloy sensing component comprised of a material having a high magnetic permeability positioned above a silicon substrate; and
   at least one conductor located adjacent a portion of interest of said at least one permalloy sensing component, said at least one conductor being positioned in thermal communication with and magnetically coupled to said portion of interest;
   wherein said system is structured such that a current may be initiated through said at least one conductor to heat said portion of interest by thermal conduction of heat resulting from passing said current through said at least one conductor to a temperature of at least approximately 300° C.;
   further wherein said system is structured such that said current creates a magnetic field at said portion of interest, the combination of said magnetic field and said temperature resulting in the modification of an anisotropy of said portion of interest of said permalloy sensing component.

7. The system of claim 6 wherein said at least one conductor comprises a current strap.

8. The method of claim 6 wherein said at least one permalloy sensing component comprises NiFe alloy.

9. The method of claim 6 wherein said at least one permalloy sensing component comprises TaN alloy.

10. A sensor, comprising:
    a substrate;
    a permalloy sensing component secured relative to said substrate;
    a conductor secured relative to the permalloy sensing component, the conductor capable of producing resistive heating; and
    the conductor is sufficiently thermally and magnetically coupled to the permalloy sensing component such that a current passing through the conductor can heat the permalloy sensing component via resistive heating to a heated temperature, and can also create a magnetic field at the permalloy sensing component, where said heated temperature and said magnetic field collectively are sufficient to modify an anisotropy of said permalloy sensing component.

* * * * *